United States Patent [19]

Zirwick

[11] Patent Number: 4,533,866
[45] Date of Patent: Aug. 6, 1985

[54] CIRCUIT FOR AUTOMATICALLY SETTING A PREDETERMINED FREQUENCY COMPONENT OF THE SWEEP OSCILLATOR OF A SPECTRUM ANALYZER TO A PRESCRIBED POINT OF THE FREQUENCY COORDINATES OF A DISPLAY DEVICE

[75] Inventor: Kurt Zirwick, Greifenberg, Fed. Rep. of Germany

[73] Assignee: Rohde & Schwarz GmbH & Co. KG, Fed. Rep. of Germany

[21] Appl. No.: 499,485

[22] Filed: May 31, 1983

[30] Foreign Application Priority Data

May 29, 1982 [DE] Fed. Rep. of Germany ....... 3220462

[51] Int. Cl.³ ............................................. G01R 23/16
[52] U.S. Cl. ................................ 324/77 B; 324/77 CS
[58] Field of Search .................. 324/77 R, 77 B, 77 C, 324/77 CS, 77 D, 121 R; 364/518, 485

[56] References Cited

U.S. PATENT DOCUMENTS

| | | | |
|---|---|---|---|
| 3,868,568 | 2/1975 | Ashida | 324/77 CS |
| 3,876,946 | 4/1975 | La Clair | 324/77 CS |
| 3,916,319 | 10/1975 | Hawley | 324/77 D |
| 4,118,666 | 10/1978 | Bernstein | 324/77 C |
| 4,325,023 | 4/1982 | Zirwick | 324/77 |
| 4,374,358 | 2/1983 | Hirose | 324/77 B |
| 4,430,611 | 2/1984 | Boland | 324/77 C |
| 4,451,782 | 5/1984 | Ashida | 324/77 C |

FOREIGN PATENT DOCUMENTS 2720896 11/1978 Fed. Rep. of Germany .

Primary Examiner—Michael J. Tokar
Attorney, Agent, or Firm—Hill, Van Santen, Steadman & Simpson

[57] ABSTRACT

In order to automatically set a predetermined frequency component of a voltage-controlled oscillator of a spectrum analyzer which is swept by a sweep voltage to a prescribed point of a frequency coordinate on a display device, the oscillator is connected into a phase control loop of a frequency synthesizer as its oscillator. This connection is by way of one switch position of a transfer switch, in which the tuning voltage supplied by a phase comparator of the control loop is supplied to a storage element and, in the other switch position, the phase control loop is opened and the output of the network connected to the storage element is connected to the control input of the oscillator. The network is controllable by way of a control voltage such that the stored tuning voltage may be supplied to the control input of the oscillator as a reference voltage for the sweep voltage.

6 Claims, 4 Drawing Figures

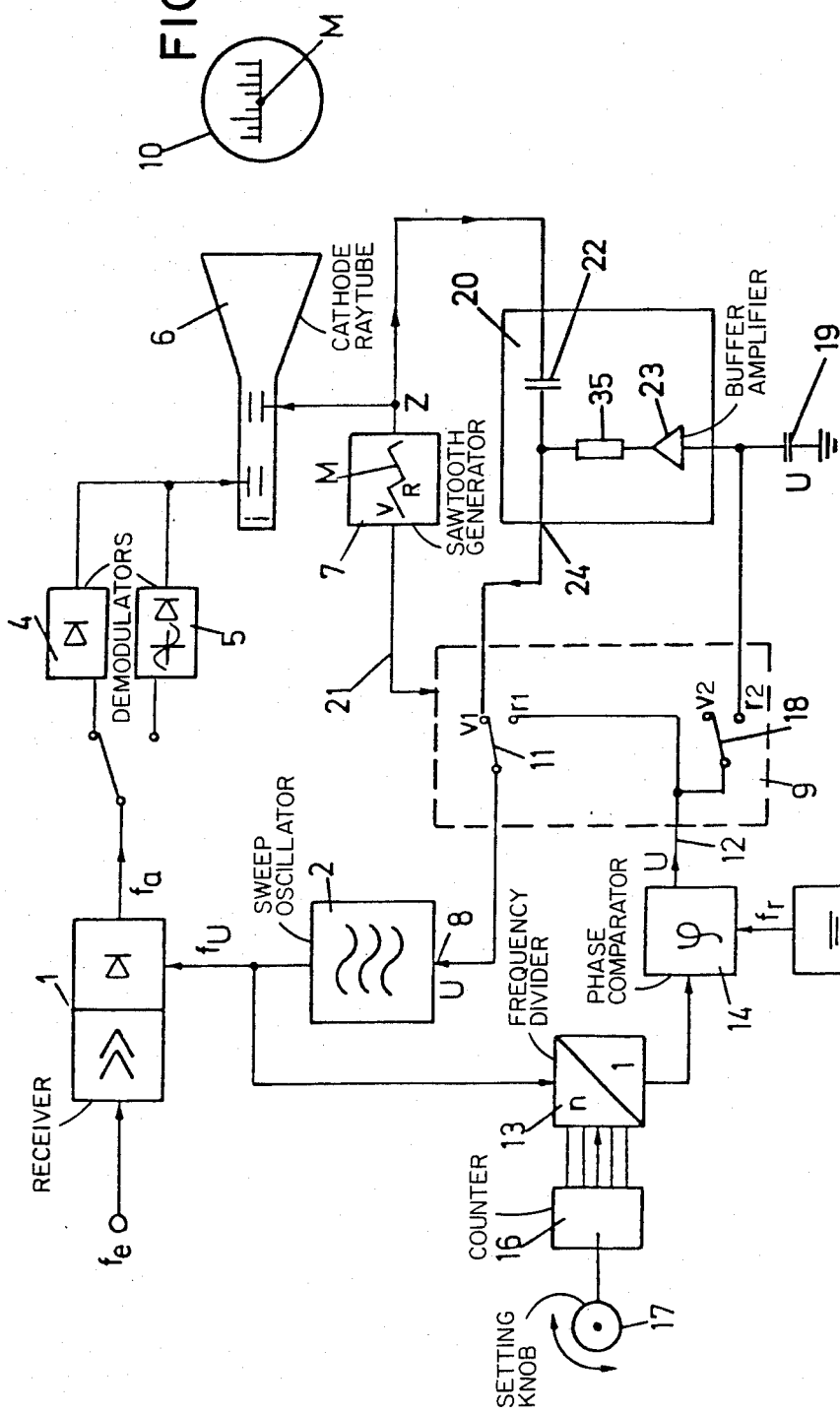

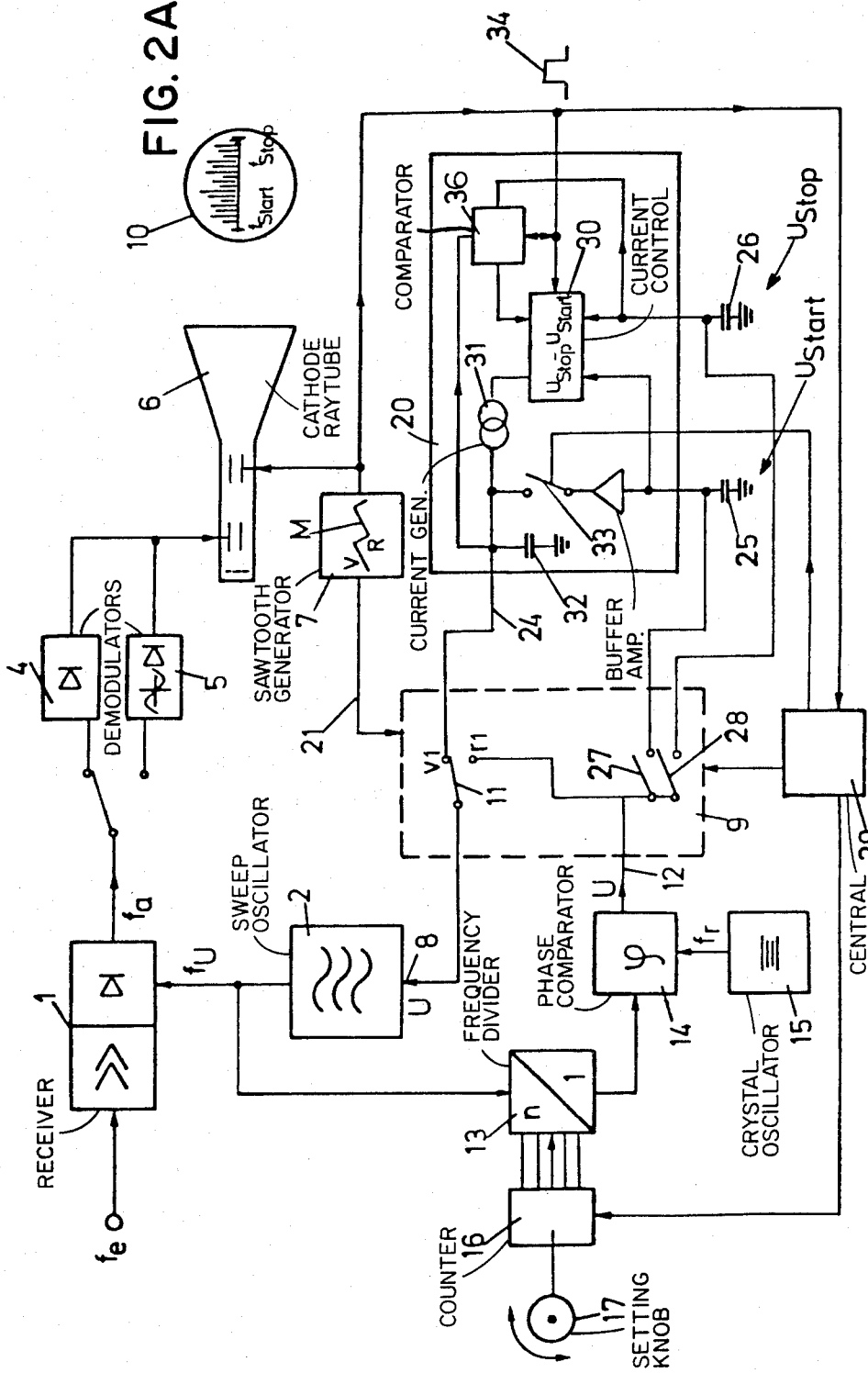

CIRCUIT FOR AUTOMATICALLY SETTING A PREDETERMINED FREQUENCY COMPONENT OF THE SWEEP OSCILLATOR OF A SPECTRUM ANALYZER TO A PRESCRIBED POINT OF THE FREQUENCY COORDINATES OF A DISPLAY DEVICE

BACKGROUND OF THE INVENTION

1. Field of the Invention

The present invention relates to a spectrum analyzer, and more particularly to a circuit for automatically adjusting a predetermined frequency component of a voltage-controlled oscillator of a spectrum analyzer swept by a sweep voltage to a prescribed point of the frequency coordinate of a display device.

2. Description of the Prior Art

Circuits of the general type set forth above are known, for example, from the German published application No. 27 20 896, fully incorporated herein by this reference. The known circuits operate with analog output quantities; they cannot be very universally employed; frequency errors due to offsets are also feared; and their use, moreover, is restricted due to the lock-in range of the control circuits required for this purpose.

SUMMARY OF THE INVENTION

It is therefore the object of the invention to provide a circuit of the type generally set forth above which can be employed in combination with a frequency synthesizer and which enables the setting of the prescribed points of the frequency coordinates in a simple manner by way of the frequency synthesizer. Beginning with a circuit of the type initially mentioned, the above object is achieved, according to the present invention, in that the oscillator can be connected into a phase control loop of a frequency synthesizer as its oscillator and connectible by way of a transfer switch in one switch position to apply a tuning voltage from a phase comparator of the control loop to a storage element. In the other switch position, the phase control loop is opened and the output of a network connected to the storage element is connected to the control input of the oscillator. The network is controllable by a control voltage such that the stored tuning voltage is supplied to the control input of the oscillator as a reference voltage for the sweep voltage.

A circuit constructed in accordance with the present invention is based on a known device for generating frequency marks by way of a synthesizer which is formed in the return period of the sweep voltage upon exploitation of the sweep oscillator via the structure of a corresponding phase control loop as disclosed in the German Pat. No. 29 14 143, corresponding to U.S. Pat. No. 4,325,023, granted April 13, 1982 and fully incorporated herein by this reference. According to the invention, this known circuit for generating frequency marks is modified such that the tuning voltage stored in the storage element which was generated during the synthesizer operation can be subsequently directly exploited for driving the sweep oscillator and, therefore, determines prescribed points of the frequency coordinates of the display device with crystal frequency accuracy. In the most simple case, for example, the beginning of the frequency coordinates can be very precisely fixed on the display screen in this manner in that this is simply set in the synthesizer mode to the frequency value which corresponds to the beginning of the sweep width. The oscillator then automatically begins the sweep sequence with this frequency. Another possibility lies in prescribing both the beginning and the end of a spectral representation of a frequency band by way of the synthesizer setting and storing the two different tuning voltages deriving therefrom for the beginning and end in separate storage elements. Therewith, a sweep oscillator of, for example, a panorama receiver can be tuned in an analog manner between two frequency values precisely rigidly prescribed by the synthesizer settings and the representation range boundaries for the panorama display are therefore exactly prescribed. Such a possibility was heretofore possible only by way of complicated, analog control circuits, for example, by way of corresponding manual positional displacement and level shifts of the sweep voltage. Given a circuit arrangement constructed in accordance with the present invention, however, this is possible in a significantly more simple and more precise manner. In addition, the invention also provides the advantage that the actual reception portion in which the corresponding sweep voltage control must be executed can be set off from a control portion controlling the sweep event since, given the invention, it is not necessarily tuning voltages which must be transmitted over long-distance lines but, rather, at most corresponding start signals which then automatically initiate voltage sequences in the receiving portion which are set at the synthesizer.

According to the invention, it is also possible in a simple manner to frequency stabilize an analog voltage-controlled or current-controlled sweep oscillator to a predetermined frequency, i.e. to always allocate an accurately pre-selectable frequency on the frequency coordinate to the analog sweep voltage. In this case, it is merely necessary in the networks to superimpose the sweep voltage supplied to the frequency coordinate of the display device with the tuning voltage stored in the storage element.

BRIEF DESCRIPTION OF THE DRAWINGS

Other objects, features and advantages of the invention, its organization, construction and operation will be best understood from the following detailed description, taken in conjunction with the accompanying drawings, on which:

FIG. 1 is a basic circuit diagram of an embodiment of a spectrum analyzer constructed in accordance with the invention;

FIG. 1A is a front view of the display tube of FIG. 1;

FIG. 2 is a basic circuit diagram of another embodiment of a spectrum analyzer constructed in accordance with the invention; and FIG. 2A is a front view of the display tube of the circuit of FIG. 2.

DESCRIPTION OF THE PREFERRED EMBODIMENTS

Referring to FIG. 1, a spectrum analyzer is illustrated as comprising a receiver 1 for receiving a frequency $f_e$ which is converted therein with the output frequency $f_U$ of a sweep oscillator 2 into an intermediate frequency $f_a$ suitable for evaluation. This intermediate frequency, for example, is supplied to the vertical deflecting system of a cathode ray tube 6 over various demodulator arms 4, 5. The horizontal deflecting system of the cathode ray tube 6 is connected to a sweep generator 7, for example, to a sawtooth generator, whose sawtooth voltage exhibits a linear rise and a linear fall.

The sweep oscillator 2 may be tuned with respect to its output frequency by way of a control input 8 as a function of an applied d.c. voltage. For its operation as a sweep oscillator, the control input 8 can be directly connected to the output of the sawtooth generator 7.

The sweep oscillator 2 can be inserted as an oscillator in a phase control loop of a frequency synthesizer in a known manner. To this end, for example, a frequency divider 13 is provided, its division factor being digitally-adjustable over a pre-connected counter 16 by way of a setting knob 17. The output frequency $f_U$ of the oscillator 2 is supplied to the input of the frequency divider 13 and the divided output frequency is supplied to a phase comparator 14 to which, in addition, a reference frequency $f_r$ is supplied by a crystal oscillator 15. The phase comparator 14 includes an output 12 which can be connected by way of a transfer switch 9 to the control input 8 of the oscillator. In the embodiment of the invention illustrated in FIG. 1, the transfer switch 9 comprises a first switch contact 11 which is controlled over a line 21 as a function of the sweep generator 7 such that it assumes a switch position v1 in the forward period of the sweep voltage and assumes the respective switch position r1 during the return period. Therefore, the phase control loop for the synthesizer is closed in the return switch position r1. A second switch 18 is actuated in synchronism with the switch 11 and assumes the closed switch position r2 during the return phase and is open in the position v2 during the forward phase v of the sweep voltage Z. The switch contact v1 of the switch 11 is connected to the output of a network 20, and the switch contact r2 is connected to a storage capacitor 19 which is likewise connected to the network 20. In the exemplary embodiment of FIG. 1, the network 20 serves for superimposing the output voltage Z of the sweep oscillator 7 with the voltage stored in the storage capacitor 19. To this end, the network 20 comprises a coupling capacitor 22 over which the symmetrical sawtooth voltage Z is supplied. The output voltage U of the capacitor 19 is fed to the other end of the capacitor 19 as an average voltage by way of a buffer amplifier 23 and a resistor 35.

When the transfer switch 9 in the circuit illustrated in FIG. 1 assumes the switch position r1, r2 with its individual contacts 11 and 18 (return period R of the sweep voltage), then the phase control loop is closed and, given frequency and phase equality between the frequency $f_r$ and the divided output frequency $f_U$, the phase comparator supplies a tuning voltage U for the control input 8 of the sweep oscillator 2, which tuning voltage is directly proportional to the desired output frequency $f_U$ set at the adjustment knob 17. In the switch position r1, r2 this tuning voltage U is supplied not only to the control input 8 of the oscillator 2, but also by way of the contact 18 is simultaneously supplied to the storage capacitor 19 and stored by the capacitor. When the transfer switch 9 is switched into the switch position v1, v2, the control loop 12 is opened and the capacitor 19 is disconnected from the control loop 12. The symmetrical a.c. sweep voltage is applied to the input of a network 20. This sawtooth voltage is transmitted to the output 24 of the network 20 and proceeds by way of the switch 11 to the control input 8 of the oscillator 2. The supplied a.c. voltage Z is symmetrical to its arithmetic mean which, after separation by the coupling capacitor 22, is formed by the tuning voltage U. It therefore occurs that the center M of the sawtooth voltage always sets that frequency at the sweep oscillator 2 which has lead, over the synthesizer, to the tuning voltage U. Therefore, the oscillator 2 is swept about a center frequency precisely defined by the synthesizer setting, the center frequency, when the sweep voltage Z is simultaneously employed as the x-deflection voltage for the picture tube 6, always being assigned to the image center M of the picture screen 10.

The network 20 can be set to a multitude of reference points. It is also possible in this manner to precisely determine any other point of the frequency coordinate of the picture screen 10 by the synthesizer setting. The voltage U of the synthesizer setting always turns the reference point for the control quantity externally supplied to the network 20, whereby this control quantity can also be as desired.

There are phase comparators 14 which already have corresponding storage capacitors included therein, i.e. which hold the tuning voltage once it is set. In this case, a separate storage capacitor 19 can be omitted. It must only be observed that the loop can be opened such that the stored tuning value is held and can continue to be employed in the sense of the present invention for tuning of the oscillator.

FIG. 2 illustrates another embodiment of the invention which may serve to determine a periodic, analog tuning of the sweep oscillator 2 between two rigidly-prescribed frequency values (start and stop of, for example, a spectrum display). To this end, two separate storage capacitors 25, 26 are assigned to the network 20, these being connectible by way of separate transfer switch 27, 28 to the output 12 of the phase comparator 14. The synthesizer 13, 16 is successively set in a known manner to the desired start and stop frequencies $f_{start}$ and $f_{stop}$ respectively. This, for example, can occur during the return of the display. To this end, the synthesizer counter 16 is correspondingly driven by way of an additional, central control circuit 29 as a function of the sweep generator 7. In this phase, the switch 11 is in the closed position r1 and the phase control loop, therefore, is again closed. The switches 27 and 28 are likewise controlled by the central control unit 29 such that these are successively closed. Therefore, for example, the switch 27 is closed when the frequency $f_{start}$ is set at the synthesizer. Therewith, that tuning voltage $U_{start}$ which corresponds to the start frequency is also automatically stored in the capacitor 25. When, during the same return or during an intermediately-following return period, the synthesizer is then tuned to the stop frequency $f_{stop}$, then the switch 27 is simultaneously opened and the switch 28 is closed instead, so that the tuning voltage $U_{stop}$ corresponding to the stop frequency is stored in the capacitor 26. A circuit 30 is provided in the network 20 which controls a current generator 31 as function of the supplied voltages $U_{start}$ and $U_{stop}$ such that the current generator respectively supplies a current to the output 24 and to the storage capacitor 32 which is directly proportional to the difference between the two voltages $U_{start}$ and $U_{stop}$, in particular, within a prescribed time which, for example, corresponds to the forward phase of the sweep oscillator 7. Therefore, the current generator 31 generates a voltage of the magnitude $U_{stop}-U_{start}$ at the capacitor 32 within the prescribed time. Given a closed switch 33, which is likewise controlled as a function of the central control circuit 29, the capacitor 25 is likewise connected to the output 24 over a buffer amplifier.

When a corresponding switch pulse 34 arrives at the input of the network 20 at the beginning of the forward period of the sweep oscillator 7, then the switch 33 is simultaneously opened and, beginning with the voltage $U_{start}$ available at the output 24, the voltage at the capacitor 32 is therewith proportionally increased by way of the current generator 31 until, finally, the value $U_{stop}$ is reached after the prescribed time, i.e. at the end of the forward phase. Therefore, the frequency limits of the frequency coordinate on the picture screen representation 10 are accurately prescribed by the preceding synthesizer setting. This presetting of the limits can be automatically repeated, occurring by a corresponding drive of the central control circuit 29. The limits can be just as easily manually changed by the user by a corresponding setting of the synthesizer.

The network 20 also comprises a comparator 36 in which the deviation of the control voltage generated at the output 24 from the stop voltage $U_{stop}$ stored in the memory 26 is continuously measured. The circuit 30 can be controlled by way of the comparator 36 such that potential deviations are corrected for the next forward phase.

The prescription of precise frequency limits illustrated in FIG. 2 can also be multiply applied to a plurality of separate spectral representation lines by corresponding multiple connectible and disconnectible storage capacitors. Moreover, it is also possible to set different display sections with different sequence rates in one display line by three or more separately connectible storage capacitors. What is significant is that different, predetermined points of the frequency display on the picture screen can be precisely predetermined with the synthesizer and the greatest variety of control sequences can then be derived from these points. Of course, a corresponding frequency mark can be set over the stored voltage values in the sense of the aforementioned German Pat. No. 29 14 143 and its corresponding U.S. Pat. No. 4,325,023 and can be adjusted by way of the synthesizer.

Although I have described my invention by reference to particular illustrative embodiments thereof, many changes and modifications of the invention may become apparent to those skilled in the art without departing from the spirit and scope thereof. I therefore intend to include within the patent warranted hereon all such changes and modifications as may reasonably and properly be included within the scope of my contribution to the art.

I claim:

1. A circuit for setting a predetermined frequency component of a voltage-controlled oscillator to a prescribed coordinate of a display of a spectrum analyzer comprising:
   a frequency generator including an output and an input;
   a phase control loop connected between said output and said input and including a phase comparator operable to compare the phase of the generated frequency with that of a reference and produce a tuning voltage;
   a voltage-controlled oscillator connectible into said phase control loop and including an output connected to said input of said frequency generator, and a control input for receiving a control voltage;
   a storage element for storing tuning voltage;
   a network connected to said storage element for receiving said tuning voltage, said network including a control input for receiving a control signal and responsive thereto to emit a sweep voltage; and
   switching means connected to said network, to said phase comparator, to said storage element and to said control input of said oscillator, said switching means operable to a first condition to connect said phase comparator to said control input of said oscillator and to said storage element to cause said oscillator to operate at a frequency defined by said tuning voltage and operable to a second condition to connect said control input of said oscillator to said network to supply said sweep voltage of said network to said oscillator.

2. The circuit of claim 1, and further comprising:
   a sweep generator for generating a sawtooth voltage, said generator connected to said switching means for controlling said switch conditions in accordance with said sawtooth voltage.

3. The circuit of claim 1, wherein:
   said generator is connected to said control input of said network to provide said sawtooth voltage as said control signal; and
   said network including means for superposing said sawtooth and tuning voltages such that the control voltage supplied to said control input of said oscillator as a sweep voltage having a center which corresponds to said tuning voltage.

4. A circuit for setting predetermined frequency components of a voltage-controlled oscillator to prescribed coordinates of a display of a spectrum analyzer, comprising:
   a frequency generator including an input and an output, and operable to produce a first frequency representing a first coordinate and, alternately, a second frequency representing a second coordinate;
   a phase control loop connected between said input and said output and operable to compare the phases of the generated frequencies with that of a reference and provide respective first and second tuning voltages;
   a voltage-controlled oscillator connectible into said phase control loop, including an output connected to said input of said frequency generator, and a control input for receiving a control voltage;
   first and second storage elements for storing respective tuning voltages;
   a network connected to said storage elements including an output, a control input and means for emitting an output voltage which is initially said first tuning voltage and changes over a predetermined interval to said second tuning voltage;
   switching means connected to said phase comparator, to said first and second storage elements, to said network and to said control input of said oscillator, said switching means including first switch means operable to connect said phase comparator alternately to said first and second storage elements, and second switch means operable to connect said control input of said oscillator alternately to said phase comparator and said output of said network so that said oscillator is controlled to sweep between first and second frequencies representing coordinate limits of a frequency range.

5. The circuit of claim 4, wherein:
   said circuit further comprises a sequence control including an input for receiving a control pulse, and a plurality of outputs connected to control the operation of said first switch means, said frequency generator and said network;

said network comprises a control input for receiving said control pulse; and said network comprises an output capacitor connected to said output and to said first storage device and charged to said first tuning voltage until disconnected by said sequence control upon receipt of a control pulse to apply said first tuning voltage to said oscillator, a current generator connected to said output capacitor, and current control means including inputs connected to said first and second storage elements, a control input connected to receive said control pulse, and an output connected to said current generator, and operable in response to said control pulse to drive said current generator, to linearly charge said output capacitance, with a voltage which is said second tuning voltage minus said first tuning voltage so that said oscillator sweeps between said first and second frequencies.

6. The circuit of claim 5, and further comprising:

a sawtooth generator connected to operate said second switch means.

* * * * *